US010033355B2

(12) United States Patent
Tsukamoto

(10) Patent No.: US 10,033,355 B2
(45) Date of Patent: Jul. 24, 2018

(54) ELECTRIC POWER SUPPLY DEVICE AND SEMICONDUCTOR DEVICE

(71) Applicant: SOCIONEXT INC., Yokohama-shi, Kanagawa (JP)

(72) Inventor: Yosuke Tsukamoto, Sagamihara (JP)

(73) Assignee: SOCIONEXT INC., Yokohama (JP)

( * ) Notice: Subject to any disclaimer, the term of this patent is extended or adjusted under 35 U.S.C. 154(b) by 239 days.

(21) Appl. No.: 15/206,848

(22) Filed: Jul. 11, 2016

(65) Prior Publication Data

US 2017/0134010 A1 May 11, 2017

(30) Foreign Application Priority Data

Nov. 9, 2015 (JP) .................................. 2015-219247

(51) Int. Cl.
*H02J 4/00* (2006.01)
*H03K 3/012* (2006.01)
*H03K 19/00* (2006.01)

(52) U.S. Cl.
CPC ................ *H03K 3/012* (2013.01); *H02J 4/00* (2013.01); *H03K 19/0016* (2013.01)

(58) Field of Classification Search
CPC ....................................................... H02J 4/00
See application file for complete search history.

(56) References Cited

U.S. PATENT DOCUMENTS

| 8,368,457 | B2 * | 2/2013 | Ikenaga | G06F 1/3203 |
| | | | | 327/530 |
| 9,244,515 | B2 * | 1/2016 | Kawasaki | G06F 1/3203 |
| 9,843,195 | B2 * | 12/2017 | Itaya | H02J 4/00 |
| 2014/0070878 | A1 | 3/2014 | Kawasaki | |
| 2014/0070879 | A1 | 3/2014 | Kawasaki | |
| 2015/0137778 | A1 | 5/2015 | Miyazaki | |

FOREIGN PATENT DOCUMENTS

| JP | H10-215569 A | 8/1998 |
| JP | 2004-260933 A | 9/2004 |
| JP | 2014-057218 A | 3/2014 |
| JP | 2014-057265 A | 3/2014 |
| JP | 2015-097460 A | 5/2015 |

* cited by examiner

*Primary Examiner* — Hai L Nguyen
(74) *Attorney, Agent, or Firm* — Arent Fox LLP

(57) ABSTRACT

A voltage adjustment circuit includes switches connected in parallel between a circuit unit and an electric power supply line to which a first electric power supply voltage is applied, and changes the number of switches turned off, based on a comparison result between a target value and a second electric power supply voltage supplied to the circuit unit, to adjust the second electric power supply voltage. A control circuit decides an interval for increasing the number of switches turned off when the circuit unit changes to standby state, based on a leak current value of the circuit unit in standby state, a time in which the second electric power supply voltage changes from a first to a second value, the first and second values, and an electric potential difference by which the second electric power supply voltage changes when one switch switches between on and off.

8 Claims, 14 Drawing Sheets

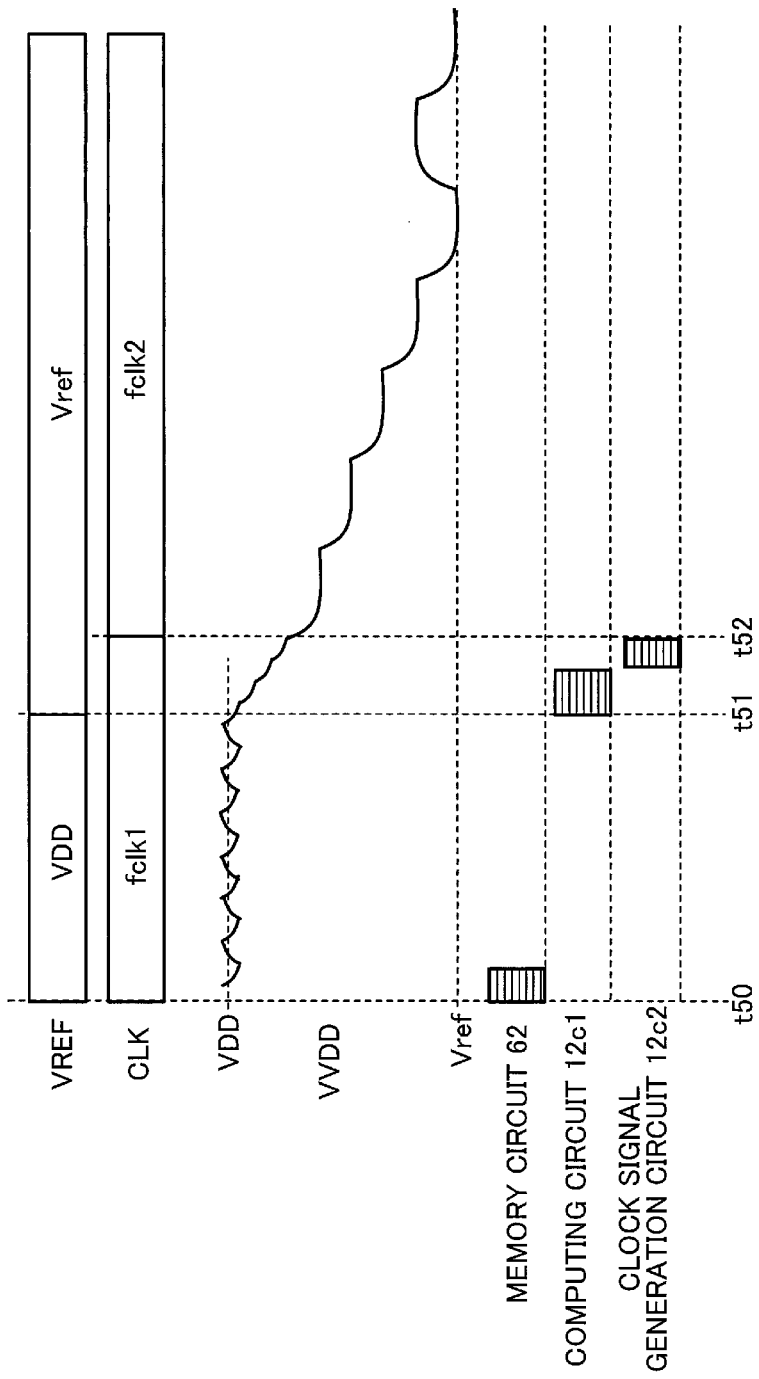

ELECTRIC POWER SUPPLY DEVICE AND SEMICONDUCTOR DEVICE

CROSS-REFERENCE TO RELATED APPLICATION

This application is based upon and claims the benefit of priority of the prior Japanese Patent Application No. 2015-219247, filed on Nov. 9, 2015, the entire contents of which are incorporated herein by reference.

FIELD

The embodiments discussed herein relate to an electric power supply device and a semiconductor device.

BACKGROUND

It is known that an operation frequency of a circuit unit or an electric power supply voltage supplied to the circuit unit is reduced in a standby state in order to reduce electric power consumption of a semiconductor device.

There is an electric power supply device that utilizes a digital voltage adjustment circuit to reduce the electric power supply voltage supplied to the circuit unit, to a target value. The digital voltage adjustment circuit includes a plurality of switches (which are configured with transistors) that are connected in parallel between an electric power supply line to which the electric power supply voltage is applied and the circuit unit. The voltage adjustment circuit compares the target value and the electric power supply voltage supplied to the circuit unit in a predetermined cycle, and increases the number of switches turned off, when the electric power supply voltage is higher than the target value, in order to reduce the electric power supply voltage.

See, for example, Japanese Laid-open Patent Publication Nos. 2014-57218, 2015-97460, 2004-260933, and 10-215569.

However, it is possible that the conventional electric power supply device causes undershoot in which the electric power supply voltage becomes lower than the target value, due to the adjustment of the electric power supply voltage which is performed when the circuit unit changes from a usual state to a standby state. It is possible that, if the circuit unit includes a memory that uses a predetermined voltage to retain its stored data, the stored data is lost due to the undershoot, for example.

Hence, it is desirable to prevent occurrence of the undershoot at the time of electric power supply voltage adjustment.

SUMMARY

According to one aspect, there is provided an electric power supply device including: a voltage adjustment circuit including a plurality of switches that are connected in parallel between a circuit unit and an electric power supply line to which a first electric power supply voltage is applied, and configured to adjust a magnitude of a second electric power supply voltage generated based on the first electric power supply voltage, by changing a number of switches turned off among the plurality of switches, based on a comparison result between a target value and the second electric power supply voltage supplied to the circuit unit; a memory circuit configured to store a current value generated between a first power supply terminal and a second power supply terminal of the circuit unit in a second state that is lower in electric power consumption than a first state, a first time in which the second electric power supply voltage changes from a first value to a second value, and an electric potential difference by which the second electric power supply voltage changes when one of the plurality of switches switches between on and off; and a control circuit configured to decide an interval of time points at which the voltage adjustment circuit increases the number of switches turned off when the circuit unit changes from the first state to the second state, based on the current value, the first value, the second value, the first time, and the electric potential difference.

The object and advantages of the invention will be realized and attained by means of the elements and combinations particularly pointed out in the claims.

It is to be understood that both foregoing general description and the following detailed description are exemplary and explanatory and are not restrictive of the invention.

BRIEF DESCRIPTION OF DRAWINGS

FIG. 14 is a time chart illustrating exemplary operation of a semiconductor device and an electric power supply device of the fourth embodiment.

DESCRIPTION OF EMBODIMENTS

Figure 1:
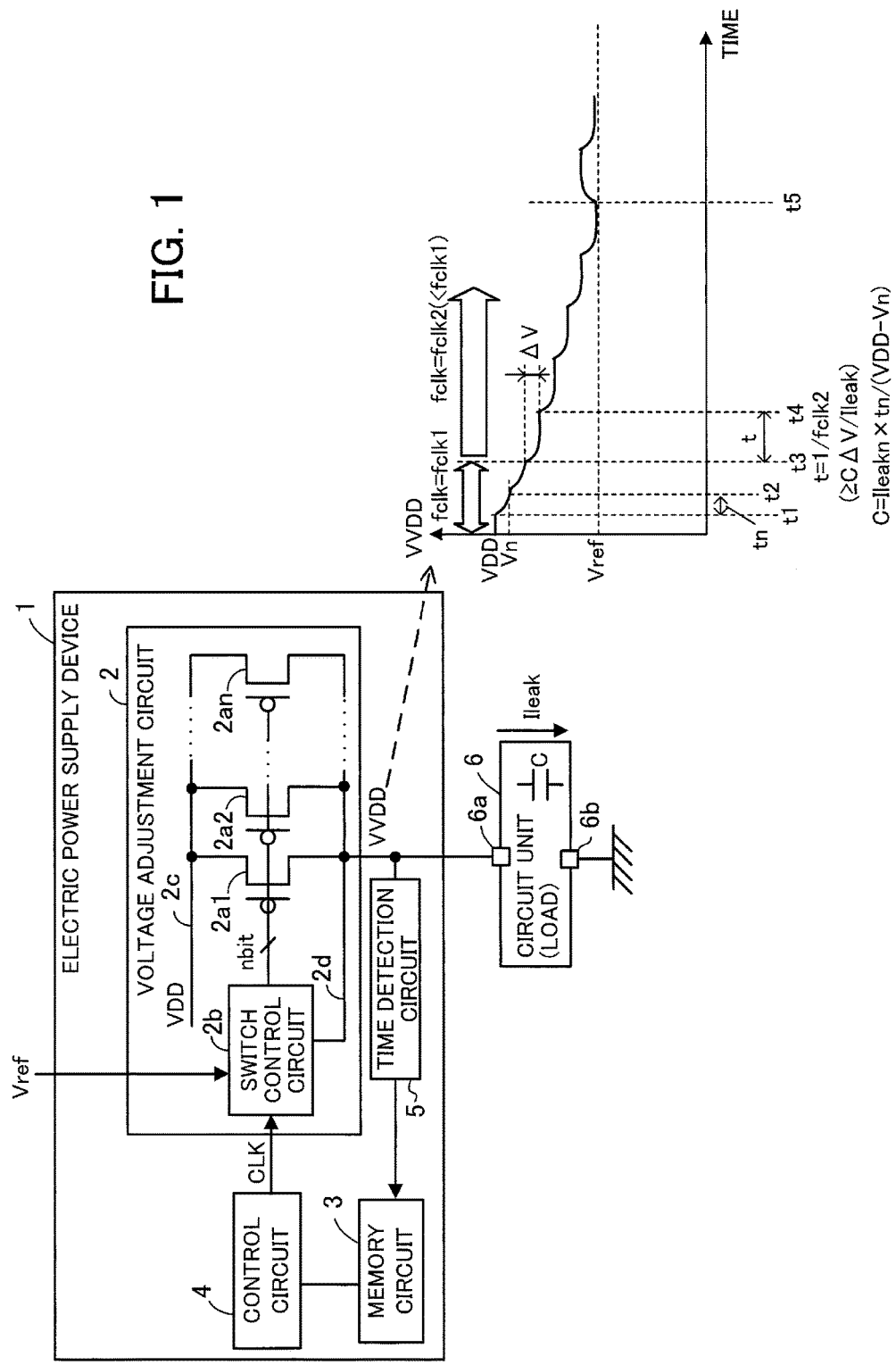
FIG. 1 illustrates an example of an electric power supply device of a first embodiment.

Several embodiments will be described below with reference to the accompanying drawings, wherein like reference numerals refer to like elements throughout.

First Embodiment

FIG. 1 illustrates an example of an electric power supply device of a first embodiment. The electric power supply device 1 includes a voltage adjustment circuit 2, a memory circuit 3, a control circuit 4, and a time detection circuit 5. For example, the voltage adjustment circuit 2 is a digital low-drop-out (LDO) voltage regulator which includes switches 2a1, 2a2, . . . , 2an and a switch control circuit 2b.

The switches 2a1 to 2an are connected in parallel between an electric power supply line 2c to which an electric power supply voltage VDD is applied and a circuit unit (a load (an electric power supply voltage supplying target) for the electric power supply device 1) 6. In the example of FIG. 1, the switches 2a1 to 2an are p-channel metal-oxide semiconductor field effect transistors (MOSFETs) but may be n-channel MOSFETs. The electric power supply voltage VDD is applied from outside of the electric power supply device 1.

The switch control circuit 2b receives a clock signal CLK supplied from the control circuit 4. The clock signal CLK decides a time point at which the switches 2a1 to 2an switch between on and off. Then, the switch control circuit 2b compares an electric power supply voltage VVDD on an electric power supply line 2d which is supplied to the circuit unit 6, with a target value Vref, at a time point based on the frequency of the clock signal CLK. Then, the switch control circuit 2b changes the number of switches turned off, among the switches 2a1 to 2an, in accordance with an n bit control signal based on the comparison result. Thereby, the magnitude of the electric power supply voltage VVDD generated based on the electric power supply voltage VDD is adjusted.

For example, the target value Vref is a voltage value that is used to retain the data stored in a memory (not illustrated in the drawings) of the circuit unit 6, when the circuit unit 6 is in a standby state. A state (mode) that retains the data stored in the memory of the circuit unit 6 in the standby state is referred to as a retention mode, in some cases.

The memory circuit 3 stores a current value (hereinafter, referred to as a leak current value) between power supply terminals 6a and 6b, which is generated when the circuit unit 6 is in a standby state. Note that the standby state is a state in which clock supply to the circuit unit 6 is stopped. The electric power consumption in the standby state of the circuit unit 6 is lower than the electric power consumption in a state in which clock is supplied (hereinafter, referred to as a usual state). The current value between the power supply terminals 6a and 6b in the standby state differs depending on the magnitude of the electric power supply voltage VVDD supplied to the circuit unit 6. Hence, leak current values corresponding to values of a plurality of electric power supply voltages VVDD may be stored in the memory circuit 3.

Further, the memory circuit 3 stores a time tn in which the electric power supply voltage VVDD applied to the power supply terminal 6a changes from a first value to a second value. In the following, the first value is the electric power supply voltage VDD, and the second value is a voltage Vn that is lower than the electric power supply voltage VDD.

It is desirable that the voltage Vn be sufficiently larger than the target value Vref. For example, the voltage Vn is set to a value between the electric power supply voltage VDD and (electric power supply voltage VDD—electric potential difference ΔV). As the voltage Vn becomes larger than the target value Vref, the frequency of the clock signal CLK can be changed more promptly, when the circuit unit 6 changes to a standby state. This prevents accumulation of electric potential differences Vlost illustrated in FIG. 2 described later, and prevents occurrence of undershoot more robustly.

Also, it is desirable that the voltage Vn be set in such a manner that the time tn is equal to or smaller than the cycle of the clock signal CLK. This is because the time tn detected from the change of the electric power supply voltage VVDD, which is caused by turning off one of the switches 2a1 to 2an, more reflects a load capacitance value of the circuit unit 6 described later.

Also, the memory circuit 3 stores the electric potential difference ΔV by which the electric power supply voltage VVDD changes when one of the switches 2a1 to 2an switches between on and off.

The control circuit 4 decides an interval of time points at which the voltage adjustment circuit 2 increases the number of switches turned off when the circuit unit 6 changes from a usual state to a standby state, on the basis of the leak current value, the electric power supply voltage VDD, the voltage Vn, the time tn, and the electric potential difference ΔV. The control circuit 4 decides the above interval, by deciding the frequency of the clock signal CLK supplied to the switch control circuit 2b, on the basis of the above parameters. This interval corresponds to the cycle t of the clock signal CLK. The control circuit 4 decides the frequency of the clock signal CLK in such a manner that the cycle t satisfies the below expression (1).

$$t \geq C\Delta V / I\text{leak} \quad (1)$$

In the expression (1), Ileak represents a leak current value generated when the electric power supply voltage VVDD is the target value Vref. C represents the load capacitance value of the circuit unit 6. The load capacitance value C is calculated by the below expression (2).

$$C = I\text{leak} n \times tn / (VDD - Vn) \quad (2)$$

In the expression (2), Ileakn is a leak current value of the circuit unit 6 when the electric power supply voltage VVDD is the voltage Vn.

The time detection circuit 5 detects the time tn in which the electric power supply voltage VVDD changes from the electric power supply voltage VDD to the voltage Vn. Note that the time tn may be stored in the memory circuit 3 in advance. In that case, the time detection circuit 5 is needless to exist.

Figure 2:
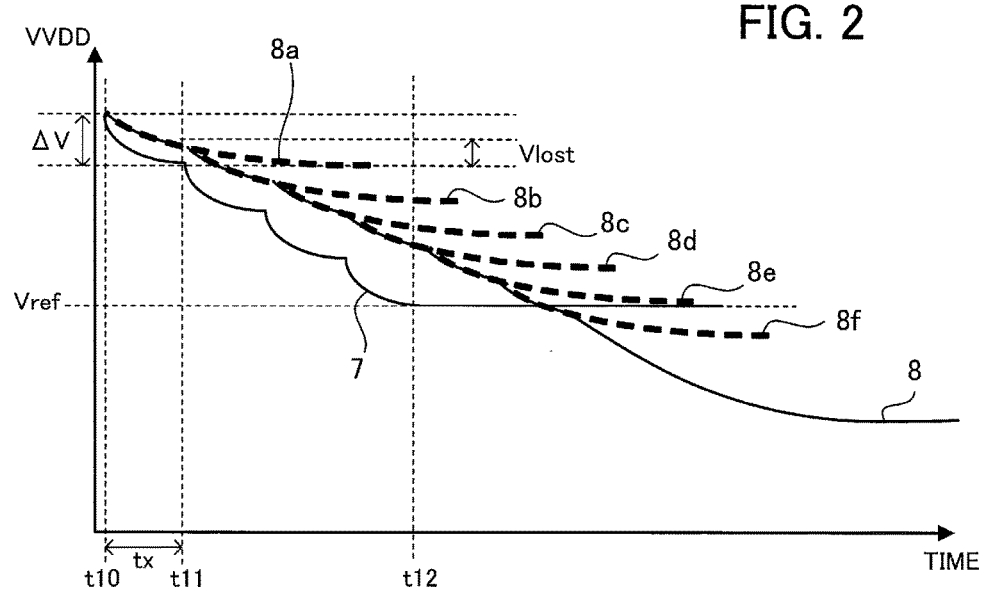
FIG. 2 illustrates an example of change of an electric power supply voltage, when an electric power supply voltage supplied to a circuit unit is compared with a target value to switch switches at certain intervals.

Next, a reason for the cycle t to satisfy the relationship of the above expression (1) will be described. FIG. 2 illustrates an example of change of the electric power supply voltage, when the electric power supply voltage supplied to the circuit unit is compared with the target value to switch the switches at certain intervals. The vertical axis represents the electric power supply voltage VVDD, and the horizontal axis represents time.

In the example of FIG. 2, the electric power supply voltage VVDD is compared with the target value Vref in each cycle (interval) t=tx. When one of the switches 2a1 to 2an turns off, if the time that it takes for the electric power supply voltage VVDD to drop by the electric potential difference ΔV is equal to or smaller than tx, undershoot does not occur with respect to the target value Vref, like a waveform 7.

In contrast, when the time that it takes for the electric power supply voltage VVDD to drop by the electric potential difference ΔV exceeds tx, the undershoot occurs, like a waveform 8. Waveforms 8a, 8b, 8c, 8d, 8e, 8f illustrate an example of voltage drops by the electric potential difference ΔV which are caused when six of the switches 2a1 to 2an each turn off. In the waveforms 8a to 8f, the time that it takes for the electric power supply voltage VVDD to drop by the electric potential difference ΔV is longer than tx. Hence, the electric power supply voltage VVDD does not drop sufficiently by the electric potential difference ΔV during tx, and an electric potential difference Vlost is accumulated, each time the switches 2a1 to 2an turn off one by one, as illustrated in FIG. 2. This accumulation causes undershoot illustrated in the waveform 8.

In order to prevent generation of the electric potential difference Vlost, the cycle t may be equal to or larger than the time that it takes for the electric power supply voltage VVDD to drop by the electric potential difference ΔV. The time that it takes for the electric power supply voltage VVDD to drop by the electric potential difference ΔV is expressed by CΔV/Ileak. Thus, the cycle t may be set to satisfy the relationship of the above expression (1).

When the circuit unit 6 changes from a usual state to a standby state, the electric power supply device of the first embodiment reduces the electric power supply voltage VVDD supplied to the circuit unit 6 as in the following. FIG. 1 illustrates an example of reduction of the electric power supply voltage VVDD that the electric power supply device 1 supplies to the circuit unit 6. The vertical axis represents the electric power supply voltage VVDD, and the horizontal axis represents time.

A frequency fclk1 is a frequency fclk of the clock signal CLK supplied from the control circuit 4 to the switch control circuit 2b when the circuit unit 6 is in a usual state. When the circuit unit 6 is in the usual state, the electric power supply voltage VVDD is the electric power supply voltage VDD.

When the circuit unit 6 changes from a usual state to a standby state, the switch control circuit 2b first turns all of the switches 2a1 to 2an into ON state. Then, the switch control circuit 2b turns off one of the switches 2a1 to 2an in response to a rising (or falling) edge of the clock signal CLK (time point t1). Thereby, the electric power supply voltage VVDD drops.

The time detection circuit 5 detects the time tn that it takes for the electric power supply voltage VVDD to drop from the electric power supply voltage VDD to the voltage Vn (time point t2). The time tn detected by the time detection circuit 5 is stored in the memory circuit 3.

The control circuit 4 calculates the load capacitance value C by the expression (2) on the basis of the leak current value Ileakn of the circuit unit 6 which is generated when the electric power supply voltage VVDD is the voltage Vn, the electric power supply voltage VDD, the voltage Vn, and the time tn, which are stored in the memory circuit 3. Then, the control circuit 4 decides the cycle t of the clock signal CLK, in such a manner to satisfy the expression (1), on the basis of the electric potential difference ΔV, the leak current value Ileak of the circuit unit 6 which is generated when the electric power supply voltage VVDD is the target value Vref, the load capacitance value C, which are stored in the memory circuit 3. The decided cycle t is stored in the memory circuit 3.

Then, the control circuit 4 changes the frequency fclk of the clock signal CLK from fclk1 to fclk2, which has a relationship of t=1/fclk2 (time point t3). The fclk2 is smaller than fclk1.

Thus, after the time point t3, the switch control circuit 2b compares the electric power supply voltage VVDD and the target value Vref in each cycle t corresponding to the time that is equal to or larger than the time that it takes for the electric power supply voltage VVDD to drop by the electric potential difference ΔV. Then, when the electric power supply voltage VVDD is larger than the target value Vref, the switches 2a1 to 2an are turned off one by one, for example (time points t4 and t5). That is, the switch control circuit 2b increases the number of switches turned off in a step-by-step manner.

Note that, at the time of change from a usual state to a standby state of the circuit unit 6 at the next time, the control circuit 4 can generate the clock signal CLK of the frequency fclk being fclk2, by using the cycle t stored in the memory circuit 3.

As described above, the electric power supply device 1 decides the cycle t on the basis of the time to and the leak current values Ileakn and Ileak. Thereby, drop of the electric power supply voltage VVDD is controlled in consideration of delay of drop of the electric power supply voltage VVDD due to the load capacitance value C and the leak current values Ileakn and Ileak. Hence, the accumulation of the electric potential difference Vlost illustrated in FIG. 2 is reduced, and thereby the occurrence of undershoot is reduced. Also, even if the circuit unit 6 includes a memory that uses a predetermined voltage (for example, target value Vref) for the purpose of retention of stored data, the stored data is prevented from being lost due to undershoot.

Second Embodiment

Figure 3:
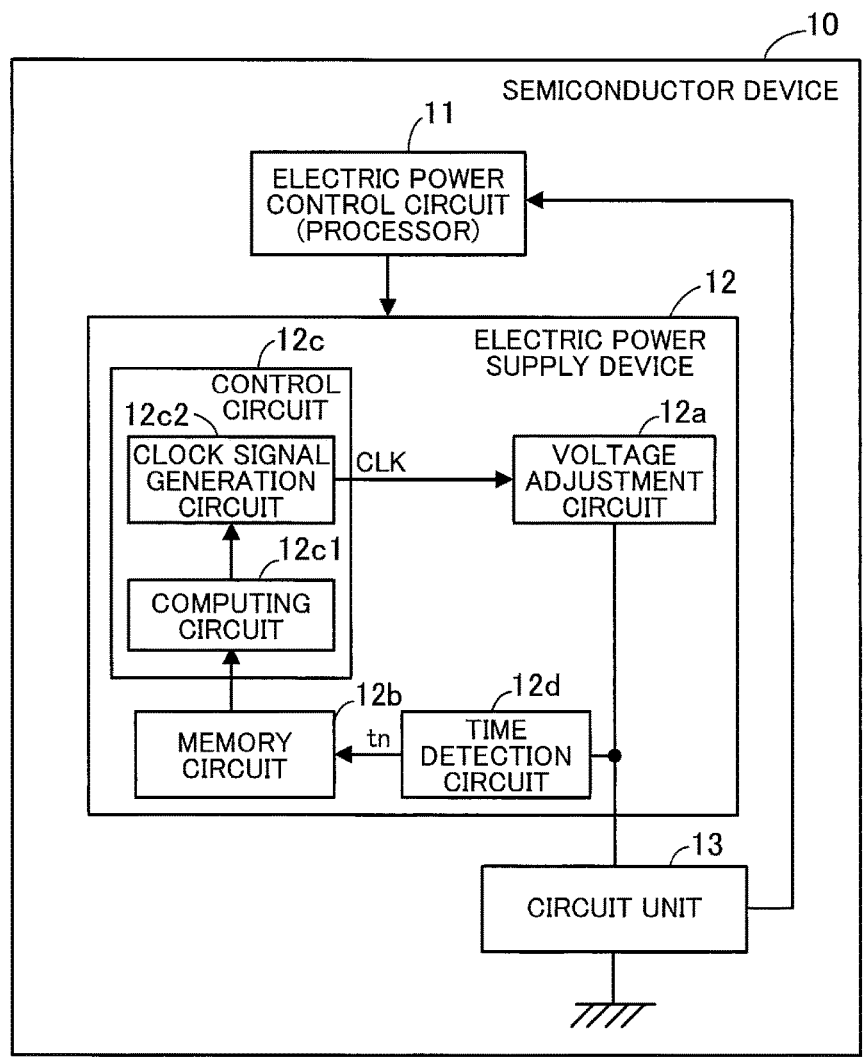
FIG. 3 illustrates an example of an electric power supply device of a second embodiment and a semiconductor device that includes the electric power supply device.

FIG. 3 illustrates an example of an electric power supply device of a second embodiment and a semiconductor device that includes the electric power supply device. For example, the semiconductor device 10 is a large scale integrated circuit (LSI) chip and includes an electric power control circuit 11, an electric power supply device 12, and a circuit unit 13. For example, the electric power control circuit 11 is a processor, such as a central processing unit (CPU), a micro processing unit (MPU), an application specific integrated circuit (ASIC), and a field programmable gate array (FPGA). For example, the electric power control circuit 11 informs the electric power supply device 12 whether to set the circuit unit 13 in a usual state or a standby state, in order to control the electric power supply device 12. The electric power supply device 12 includes a voltage adjustment circuit 12a, a memory circuit 12b, a control circuit 12c, and a time detection circuit 12d. In the following, an example of each circuit of the electric power supply device 12 will be described.

Example of Voltage Adjustment Circuit

Figure 4:
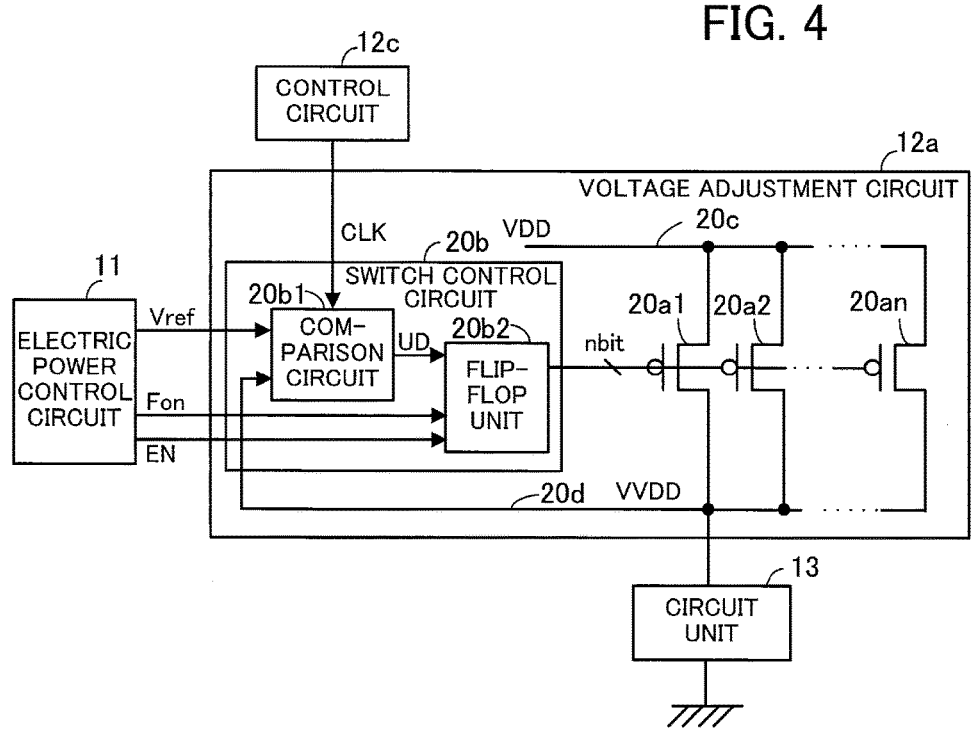
FIG. 4 illustrates an example of a voltage adjustment circuit.

FIG. 4 illustrates an example of the voltage adjustment circuit. The voltage adjustment circuit 12a includes switches 20a1, 20a2, . . . , 20an, and a switch control circuit 20b. The switches 20a1 to 20an are connected in parallel between the circuit unit 13 and an electric power supply line 20c to which an electric power supply voltage VDD is applied. In the example of FIG. 4, the switches 20a1 to 20an are p-channel MOSFETs but may be n-channel MOSFETs.

The switch control circuit 20b includes a comparison circuit 20b1 and a flip-flop unit 20b2. The comparison circuit 20b1 compares an electric power supply voltage VVDD of the electric power supply line 20d which is supplied to the circuit unit 13, with a target value Vref designated by the electric power control circuit 11 for example, at a time point based on the frequency of a clock signal CLK. The comparison circuit 20b1 outputs a signal UD based on a comparison result. The comparison circuit 20b1 sets a logic level of the signal UD to a low (L) level when the electric power supply voltage VVDD is larger than the target value Vref, and sets the logic level of the signal UD to a high (H) level, when the electric power supply voltage VVDD is equal to or smaller than the target value Vref.

The flip-flop unit 20b2 includes a plurality of flip-flops that retain control values (gate voltage values) of n bit for controlling the switches 20a1 to 20an. The flip-flop unit 20b2 sets the switches 20a1 to 20an to a full on state, when a signal EN supplied from the electric power control circuit 11 and a Fon logic level turn from a low level to a high level. When the logic level of the signal Fon becomes a low level, the flip-flop unit 20b2 cancels the full on state.

The signal EN changes its logic level from a low level to a high level, when the electric power supply voltage VDD is supplied from outside of the semiconductor device 10, for example (i.e., the power supply of the semiconductor device 10 is turned on). The signal Fon changes its logic level from a high level to a low level, when the circuit unit 13 changes from a usual state to a standby state. Also, the flip-flop unit 20b2 turns off the switches 20a1 to 20an one by one, each time the signal UD becomes a low level under a condition that the logic level of the signal EN is a high level and the logic level of the signal Fon is a low level.

Figure 5:
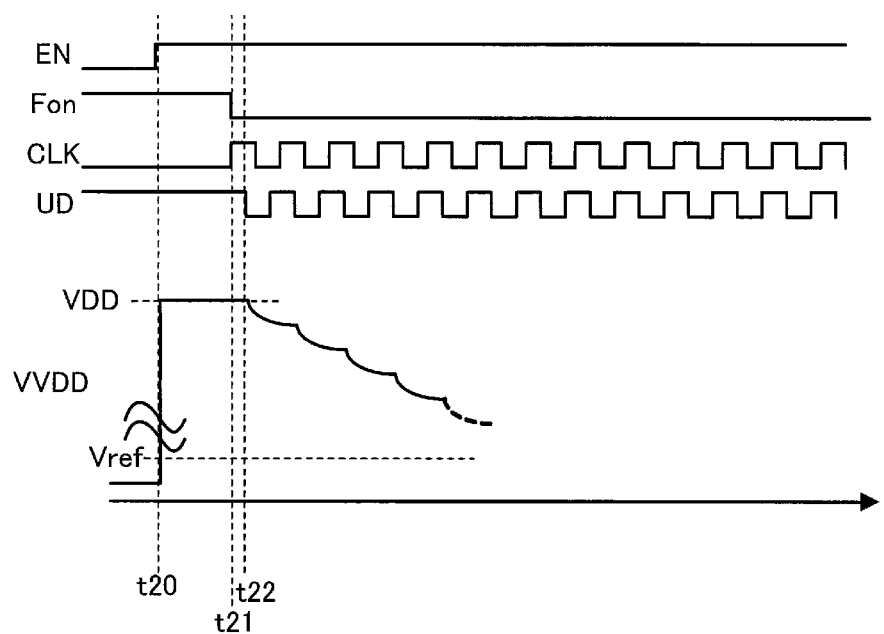
FIG. 5 is a time chart illustrating exemplary operation of a voltage adjustment circuit.

FIG. 5 is a time chart illustrating exemplary operation of the voltage adjustment circuit. FIG. 5 illustrates a situation example of signals EN, Fon, UD, clock signal CLK, and electric power supply voltage VVDD. When the logic level of the signal EN becomes a high level (time point t20), the logic level of the signal Fon is a high level, and thus the switches 20a1 to 20an become a full on state. Thereby, the electric power supply voltage VVDD becomes almost the electric power supply voltage VDD (hereinafter, described as being the electric power supply voltage VDD).

When the circuit unit 13 changes from a usual state to a standby state (retention mode), the logic level of the signal Fon change from a high level to a low level (time point t21). Also, in the example of FIG. 5, the clock signal CLK is supplied to the comparison circuit 20b1 from the time point t21. The electric power supply voltage VVDD is compared with the target value Vref at a rising edge of the clock signal CLK. When the electric power supply voltage VVDD is larger than the target value Vref, the logic level of the signal UD changes from a high level to a low level, as illustrated in FIG. 5 (time point t22). Note that the logic level of the signal UD returns to a high level, when the logic level of the clock signal CLK falls to a low level. The operation of the voltage adjustment circuit 12a is as described above.

Example of Time Detection Circuit

Figure 6:
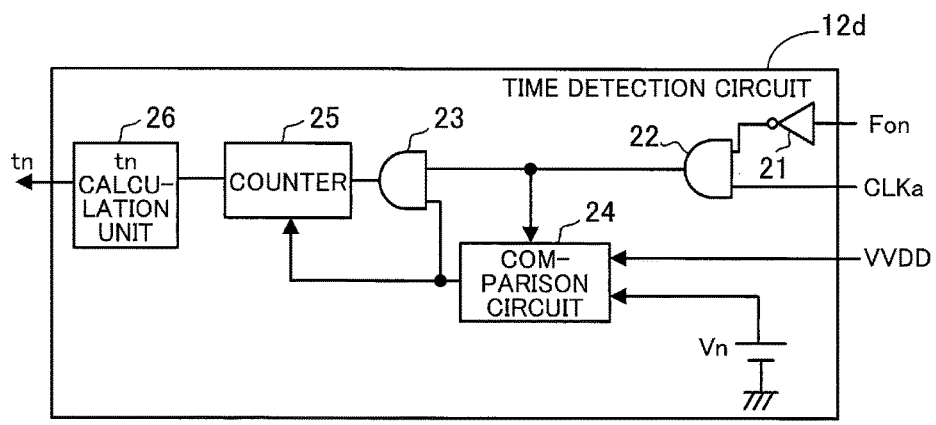
FIG. 6 illustrates an example of a time detection circuit.

FIG. 6 illustrates an example of the time detection circuit. The time detection circuit 12d includes an inverter circuit 21, AND circuits 22 and 23, a comparison circuit 24, a counter 25, and a tn calculation unit 26.

The inverter circuit 21 reverses a logic level of the signal Fon. The AND circuit 22 outputs an AND logical operation result of an output signal of the inverter circuit 21 and a clock signal CLKa. The clock signal CLKa has a higher frequency than the clock signal CLK output from the control circuit 12c. For example, the clock signal CLKa is generated by dividing the frequency of a reference clock signal output from a reference clock signal generation circuit (not illustrated in the drawings).

The comparison circuit 24 compares the electric power supply voltage VVDD and a voltage Vn when the logic level of the output signal of the AND circuit 22 becomes a high level. When the electric power supply voltage VVDD is equal to or larger than the voltage Vn, the logic level of the output signal of the comparison circuit 24 becomes a high level. When the electric power supply voltage VVDD is smaller than the voltage Vn, the logic level of the output signal of the comparison circuit 24 becomes a low level.

The AND circuit 23 outputs an AND logical operation result of the output signal of the AND circuit 22 and the output signal of the comparison circuit 24. The counter 25 counts the number of times that the logic level of the output signal of the comparison circuit 24 is a high level when the logic level of the output signal of the AND circuit 23 changes from a low level to a high level, and outputs the count value n.

The tn calculation unit 26 calculates the time tn that it takes for the electric power supply voltage VVDD to reach the voltage Vn from the electric power supply voltage VDD, on the basis of the count value n output from the counter 25 and the frequency of the clock signal CLKa. The time tn is calculated by the below expression (3).

$$t = n/f\text{clka} \quad (3)$$

Note that the logic level of the output signal of the AND circuit 22 does not become a high level, unless the logic level of the signal Fon becomes a low level. That is, the time detection circuit 12d operates when the circuit unit 13 is in a standby state.

Example of Memory Circuit

Figure 7:
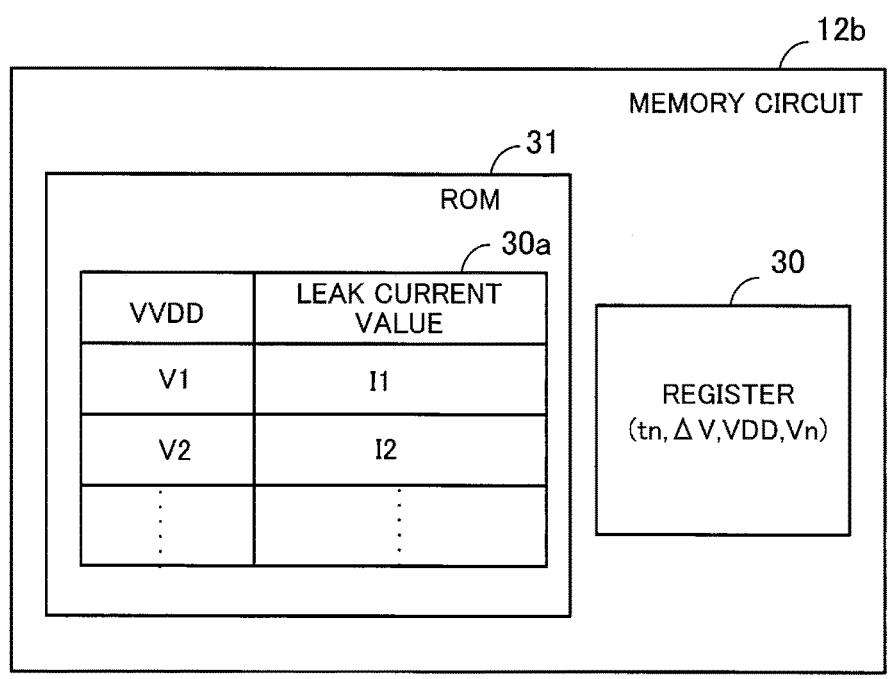
FIG. 7 illustrates an example of a memory circuit.

FIG. 7 illustrates an example of the memory circuit. For example, the memory circuit 12b includes a register 30 and a read only memory (ROM) 31, as illustrated in FIG. 7. The register 30 stores the time tn detected by the time detection circuit 12d, an electric potential difference ΔV by which the electric power supply voltage VVDD changes when one of the switches 20a1 to 20an switches between on and off, the electric power supply voltage VDD, and the voltage Vn.

The ROM 31 stores table data 30a indicating leak current values (I1, I2, . . . ) corresponding to values (V1, V2, . . . ) of a plurality of electric power supply voltages VVDD. Note that the leak current value depends on the temperature of the circuit unit 13, and thus table data indicating leak current values corresponding to values of temperatures and electric power supply voltages VVDD may be stored in the ROM 31. In that case, the leak current values corresponding to the electric power supply voltages VVDD and the temperatures of the circuit unit 13 measured by a temperature sensor (not illustrated in the drawings) are used in the control circuit 12c.

Example of Control Circuit

As illustrated in FIG. 3, the control circuit 12c includes a computing circuit 12c1 and a clock signal generation circuit 12c2. The computing circuit 12c1 calculates a load capacitance value C of the circuit unit 13 and a frequency fclk2 of the clock signal CLK on the basis of the leak current value, the electric power supply voltage VDD, the voltage Vn, the time tn, and the electric potential difference ΔV, which are stored in the memory circuit 12b. The frequency fclk2 is a value that is used to reduce the electric power supply voltage VVDD. The load capacitance value C is expressed by the aforementioned expression (2). For example, the frequency fclk2 is expressed by the below expression (4).

$$f\text{clk2} = I\text{leak}/C\Delta V \quad (4)$$

The clock signal generation circuit 12c2 generates and outputs the clock signal CLK of the frequency fclk2.

Figure 8:
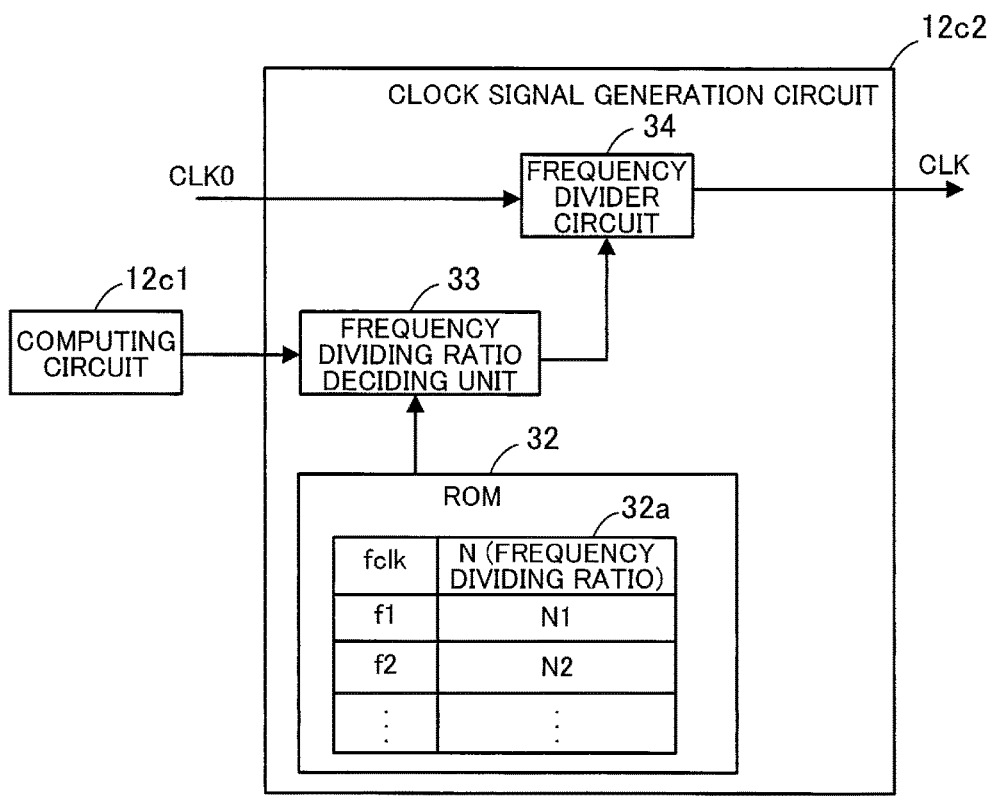
FIG. 8 illustrates an example of a clock signal generation circuit.

FIG. 8 illustrates an example of the clock signal generation circuit. The clock signal generation circuit 12c2 includes a ROM 32, a frequency dividing ratio deciding unit 33, a frequency divider circuit 34. The ROM stores table data 32a indicating frequency dividing ratios N corresponding to values of a plurality of frequencies fclk.

The frequency dividing ratio deciding unit 33 decides, from the table data 32a, a frequency dividing ratio N corresponding to the frequency fclk2 calculated by the computing circuit 12c1, and supplies the frequency dividing ratio N to the frequency divider circuit 34. For example, the frequency divider circuit 34 divides the reference clock signal CLK0 output from the reference clock signal generation circuit (not illustrated in the drawings), by the frequency dividing ratio decided by the frequency dividing ratio deciding unit 33. Thereby, the clock signal CLK of the frequency fclk2 is generated.

Next, exemplary operation of the semiconductor device 10 and the electric power supply device 12 of the second embodiment will be described.

Exemplary Operation of Semiconductor Device and Electric Power Supply Device

Figure 9:
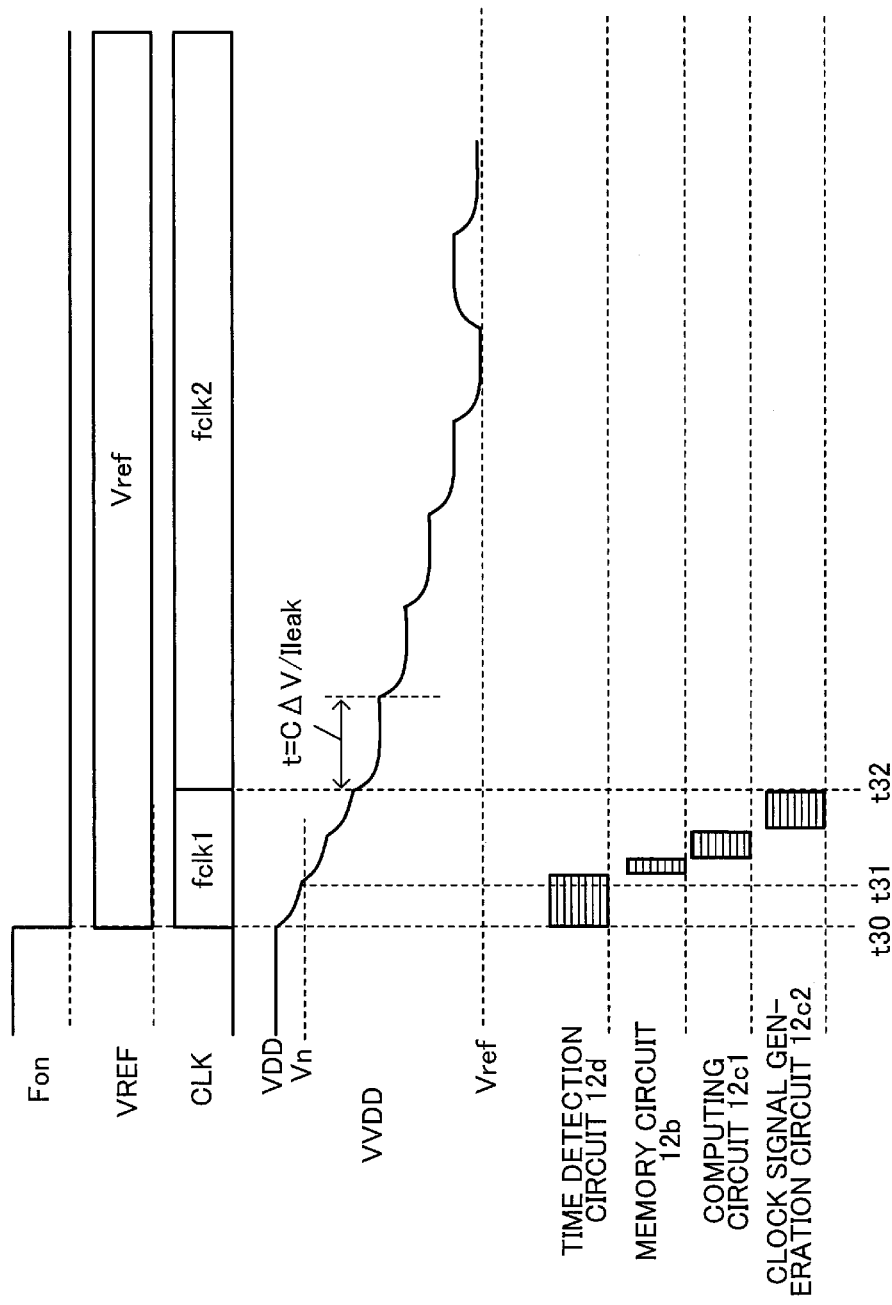
FIG. 9 is a time chart illustrating exemplary operation of a semiconductor device and an electric power supply device of the second embodiment.

FIG. 9 is a time chart illustrating exemplary operation of the semiconductor device and the electric power supply device of the second embodiment. FIG. 9, illustrates a situation example of the aforementioned signal Fon, the signal VREF that designates the target value Vref and is supplied from the electric power control circuit 11 to the voltage adjustment circuit 12a, the clock signal CLK, and the electric power supply voltage VVDD. Further, FIG. 9 illustrates an example of processing time of the time detection circuit 12d, the memory circuit 12b, the computing circuit 12c1, and the clock signal generation circuit 12c2, when the frequency of the clock signal CLK is changed.

When the circuit unit 13 changes from a usual state to a standby state (retention mode), the logic level of the signal Fon changes from a high level to a low level (time point t30). Also, in the example of FIG. 9, the target value Vref is designated by the electric power control circuit 11 from the time point t30. Further, the clock signal CLK of the frequency fclk1 is supplied to the comparison circuit 20b1. The frequency fclk1 is the frequency of the clock signal CLK which is used when the circuit unit 13 is in a usual state, and preferably a comparatively high frequency to reduce a ripple generated in the electric power supply voltage VVDD.

Also, the time detection circuit 12d compares the electric power supply voltage VVDD and the voltage Vn from the time point t30, and detects the time tn at a time point t31 when the electric power supply voltage VVDD reaches the voltage Vn. Thereafter, the time tn is written into the memory circuit 12b, and the aforementioned processes of the computing circuit 12c1 and the clock signal generation circuit 12c2 are performed. Then, at a time point t32, the frequency of the clock signal CLK switches from the frequency fclk1 to the frequency fclk2 indicated in the expression (4).

Thereby, the cycle t of the clock signal CLK becomes 1/fclk2. The cycle t becomes $C\Delta V/I_{leak}$ by the expression (4). That is, the cycle t corresponds to the time that it takes for the electric power supply voltage VVDD to drop by the electric potential difference ΔV when one of the switches 20a1 to 20an is turned off. Hence, accumulation of the electric potential difference Vlost illustrated in FIG. 2 is prevented, and occurrence of undershoot is prevented.

Although occurrence of undershoot can be prevented in the same way by setting the cycle t longer than 1/fclk2, the electric power supply voltage VVDD can be stabilized to the target value Vref in a shorter time by setting t=1/fclk2.

Third Embodiment

In the electric power supply device 12 of the above second embodiment, the memory circuit 12b stores the leak current value corresponding to the electric power supply voltage VVDD in advance. In contrast, an electric power supply device 41 of a third embodiment described below includes a circuit that detects a leak current value.

Figure 10:
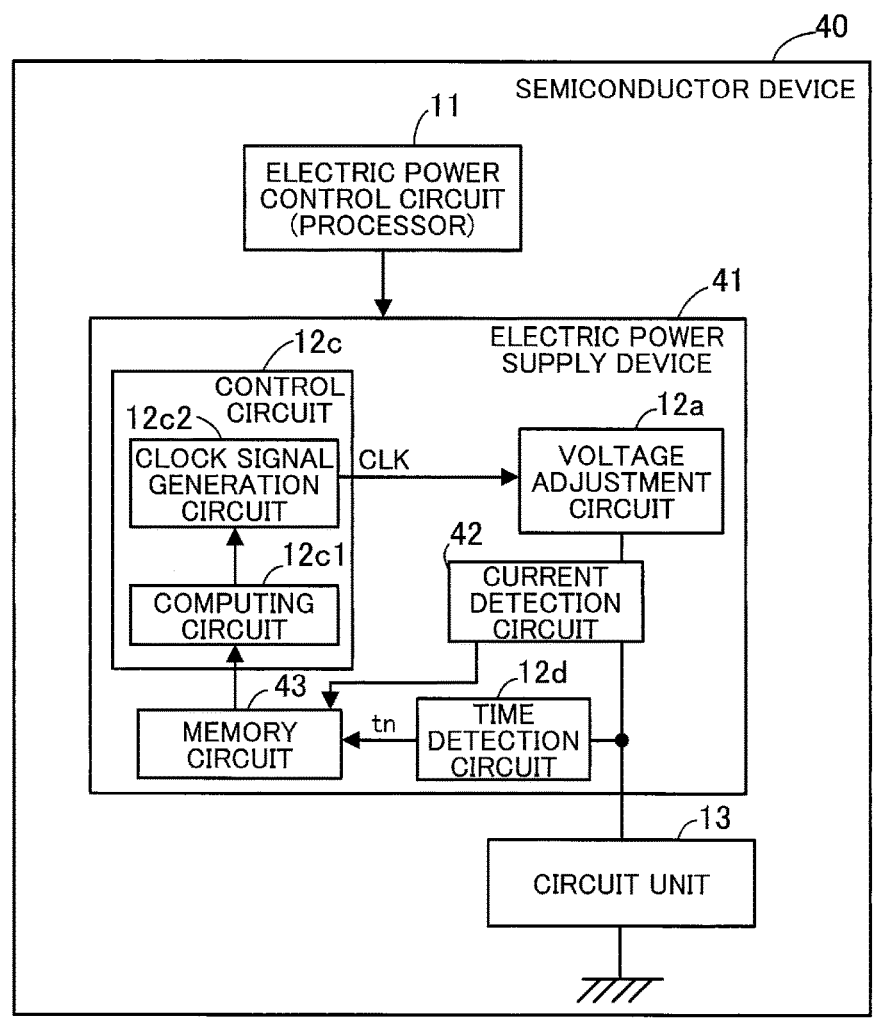
FIG. 10 illustrates an example of an electric power supply device of a third embodiment and a semiconductor device that includes the electric power supply device.

FIG. 10 illustrates an example of the electric power supply device of the third embodiment and a semiconductor device that includes the electric power supply device. The same elements as the elements illustrated in FIG. 3 are denoted with the same reference signs.

An electric power supply device 41 of a semiconductor device 40 includes a current detection circuit 42. The current detection circuit 42 is connected between a voltage adjustment circuit 12a and a circuit unit 13, and detects a leak current value of the circuit unit 13 when the circuit unit 13 is in a standby state. The memory circuit 43 stores the leak current value detected by the current detection circuit 42, as well as a time to detected by a time detection circuit 12d.

Example of Current Detection Circuit

Figure 11:
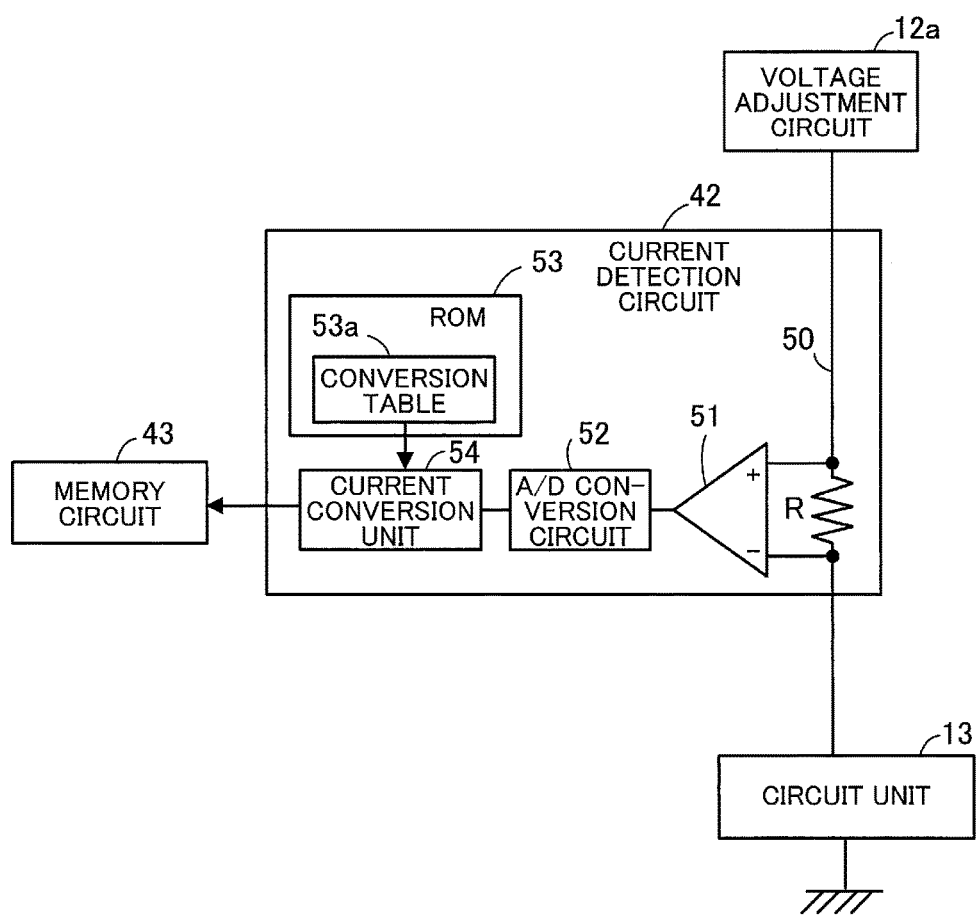
FIG. 11 illustrates an example of a current detection circuit.

FIG. 11 illustrates an example of the current detection circuit. The current detection circuit 42 includes a resistor R for current detection which is provided on a line 50 that links between the voltage adjustment circuit 12a and the circuit unit 13, a differential amplifier 51, an analog-to-digital (A/D) conversion circuit 52, a ROM 53, and a current conversion unit 54.

A non-inverting input terminal (represented by "+") of the differential amplifier 51 is connected to one end of the resistor R, and an inverting input terminal (represented by "−") is connected to another end of the resistor R. The differential amplifier 51 amplifies and outputs the electric potential difference between both ends of the resistor R.

The A/D conversion circuit 52 converts an output signal (an analog signal) of the differential amplifier 51 to a digital value. The ROM 53 stores a conversion table data 53a for converting a digital value indicating voltage to a digital value indicating current.

The current conversion unit 54 uses the conversion table data 53a to convert the digital value indicating the voltage output from the A/D conversion circuit 52 to a digital value indicating current. The digital value obtained by the current conversion unit 54 is stored in the memory circuit 43 as a leak current value of the circuit unit 13.

Exemplary Operation of Semiconductor Device and Electric Power Supply Device

Figure 12:
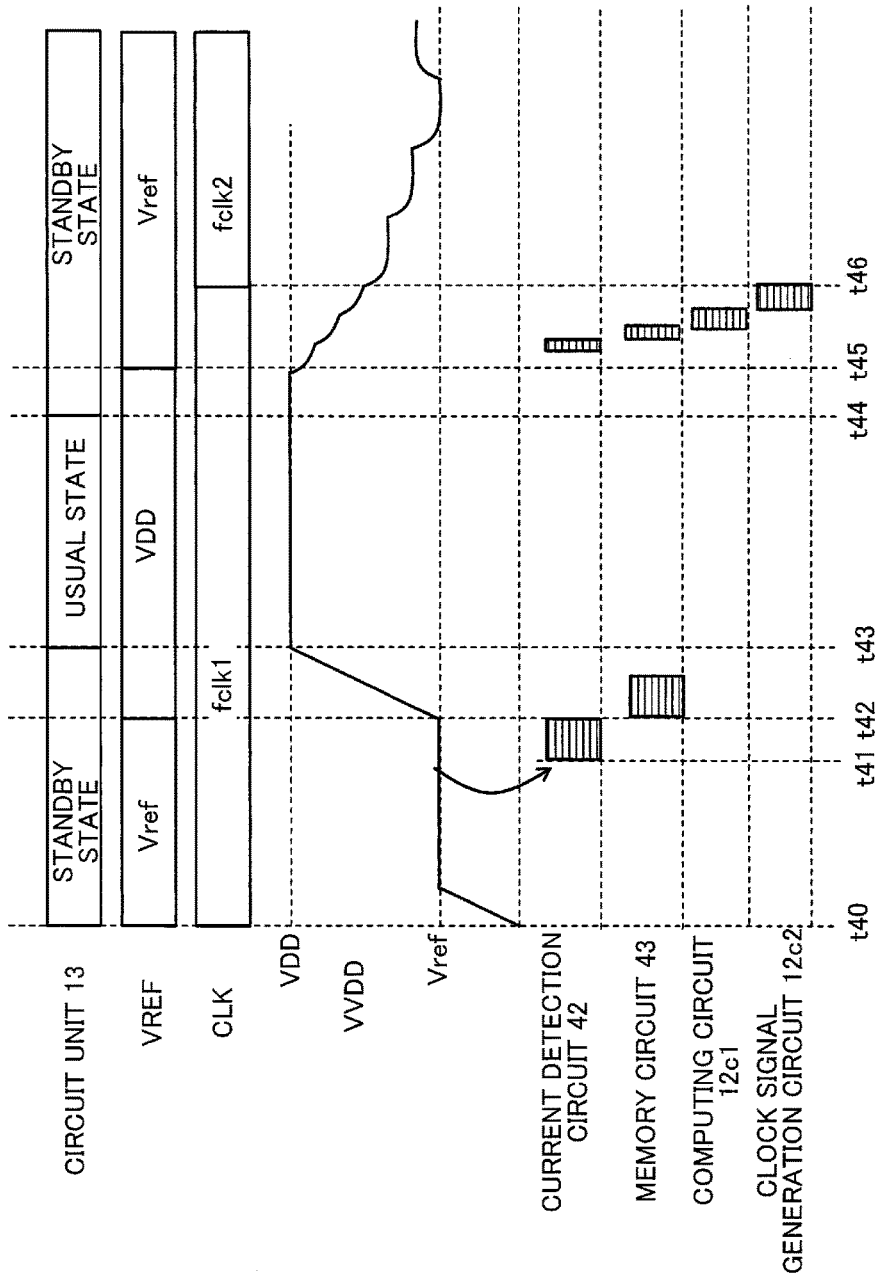
FIG. 12 is a time chart illustrating exemplary operation of a semiconductor device and an electric power supply device of the third embodiment.

FIG. 12 is a time chart illustrating exemplary operation of the semiconductor device and the electric power supply device of the third embodiment. FIG. 12 illustrates a situation example of states of the circuit unit 13, the signal VREF that designates the target value Vref and is supplied to the voltage adjustment circuit 12a from the electric power control circuit 11, the clock signal CLK, and the electric power supply voltage VVDD. Further, FIG. 12 illustrates an example of a processing time of the current detection circuit 42 and processing times of the memory circuit 43, the computing circuit 12c1, and the clock signal generation circuit 12c2, when the frequency of the clock signal CLK is changed. Note that, in FIG. 12, the processing time of the time detection circuit 12d illustrated in FIG. 9 is omitted.

When the semiconductor device 10 starts operating (the power supply is turned on), the circuit unit 13 first becomes a standby state (time point t40). In this case, the signal VREF output from the electric power control circuit 11 designates the target value Vref. Also, the frequency of the clock signal CLK is set to the frequency fclk1.

The current detection circuit 42 detects a leak current value, while the electric power supply voltage VVDD is the target value Vref (time point t41). If the signal VREF designates the voltage (the electric power supply voltage VDD) of a full on state of the switches 20a1 to 20an (time point t42), the electric power supply voltage VVDD rises. Also, the leak current value detected by the current detection circuit 42 is written into the memory circuit 43.

When the electric power supply voltage VVDD becomes the electric power supply voltage VDD, the circuit unit 13 becomes a usual state (time point t43). When the usual state ends in the circuit unit 13 (time point t44), the electric power control circuit 11 designates the target value Vref with the signal VREF (time point t45).

Also, from the time point t45, the time tn is detected by the aforementioned time detection circuit 12d, and the leak current value Ileakn is detected by the current detection circuit 42 at the time of the voltage Vn, and the time tn is written into the memory circuit 12b.

Further, the computing circuit 12c1 performs computation of the expression (2) and the expression (4) to decide the frequency fclk2, and the clock signal generation circuit 12c2 performs a generation process of the clock signal CLK. Then, at a time point t46, the frequency of the clock signal CLK switches from the frequency fclk1 to the frequency fclk2.

The above electric power supply device 41 decides the cycle t on the basis of the leak current values Ileakn and Ileak that are directly detected. Thereby, the cycle t accurately reflects delay of drop of the electric power supply voltage VVDD due to the load capacitance value C and the leak current values Ileakn and Ileak. Hence, undershoot can be prevented more appropriately.

Note that it is desirable that the detection process of the leak current value Ileak by the current detection circuit 42 be performed immediately after the semiconductor device 40 starts operating for the first time. This is to prevent increase of the leak current value Ileak due to rising temperature of the circuit unit 13.

Fourth Embodiment

Figure 13:
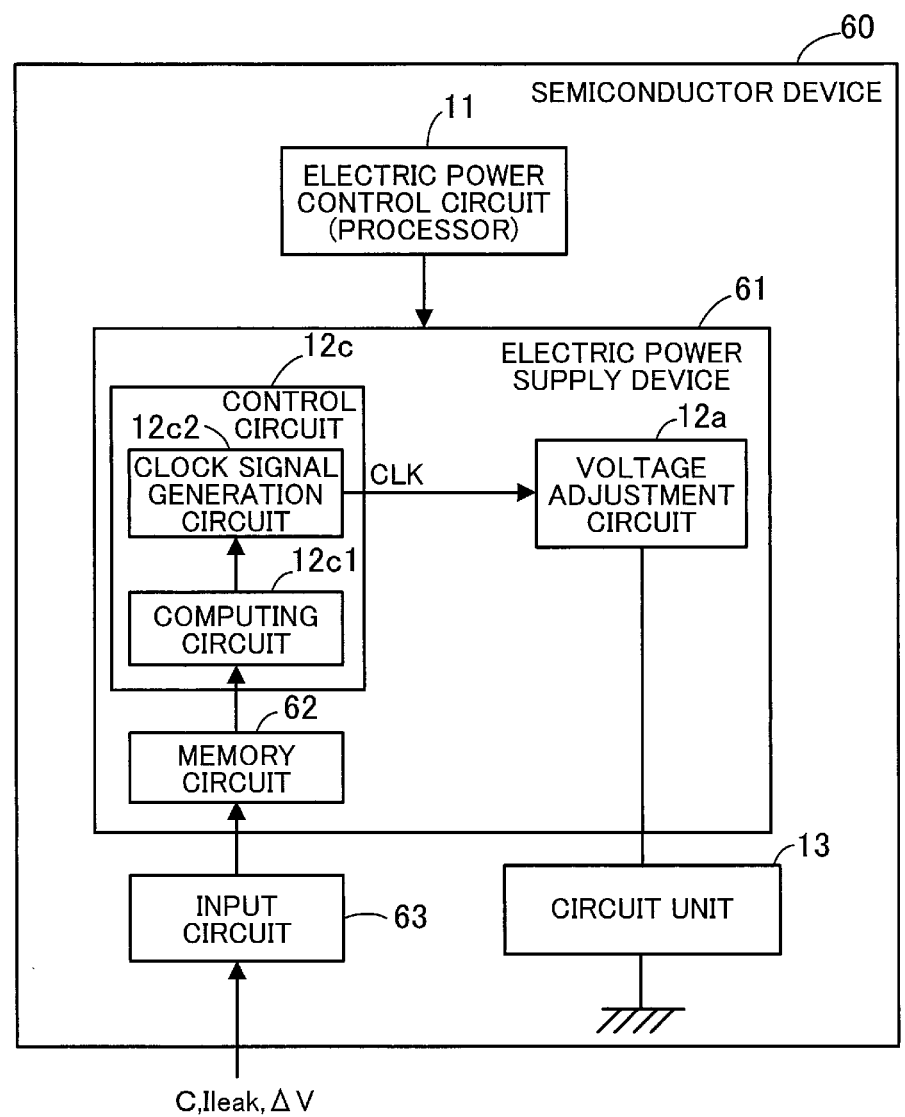
FIG. 13 illustrates an example of an electric power supply device of a fourth embodiment, and a semiconductor device that includes the electric power supply device.

FIG. 13 illustrates an example of an electric power supply device of a fourth embodiment and a semiconductor device that includes the electric power supply device. The same elements as the elements illustrated in FIG. 3 are denoted with the same reference signs.

In the semiconductor device 60 of the fourth embodiment, a time detection circuit 12d is not provided in the electric power supply device 61. Instead, a memory circuit 62 of an electric power supply device 61 stores a load capacitance value C, a leak current value Ileak, and an electric potential difference ΔV, which are input from an input circuit 63 of the semiconductor device 60.

When the load capacitance value C, the leak current value Ileak, and the electric potential difference ΔV are already known with respect to the circuit unit 13, these parameters may be given from outside of the semiconductor device 60, as illustrated in FIG. 13. In this case, the computing circuit 12c1 decides the frequency fclk2 by performing computation of the expression (4), without performing computation of the expression (2).

Exemplary Operation of Semiconductor Device and Electric Power Supply Device

FIG. 14 is a time chart illustrating exemplary operation of the semiconductor device and the electric power supply device of the fourth embodiment.

FIG. 14 illustrates a situation example of the signal VREF that designates the target value Vref and is supplied to the voltage adjustment circuit 12a from the electric power control circuit 11, the clock signal CLK, and the electric power supply voltage VVDD. Further, FIG. 14 illustrates an example of processing times of the memory circuit 62, the computing circuit 12c1, and the clock signal generation circuit 12c2.

For example, when the circuit unit 13 is in a usual state, the memory circuit 62 stores the load capacitance value C, the leak current value Ileak, and the electric potential difference ΔV, which are input from the input circuit 63 (time point t50). Note that, in a usual state, the signal VREF designates the voltage (the electric power supply voltage VDD) in a full on state of the switches 20a1 to 20an. Also, the frequency of the clock signal CLK is the frequency fclk1.

When the circuit unit 13 changes from a usual state to a standby state, the signal VREF designates the target value Vref (time point t51). Thereby, the electric power supply voltage VVDD drops by the aforementioned process of the voltage adjustment circuit 12a.

Also, at the time point t51, the computing circuit 12c1 reads out the load capacitance value C, the leak current value Ileak, and the electric potential difference ΔV which are stored in the memory circuit 62, and decides the frequency fclk2 by the expression (4). Thereafter, the clock signal generation circuit 12c2 performs a generation process of the clock signal CLK. Then, at a time point t52, the frequency of the clock signal CLK switches from the frequency fclk1 to the frequency fclk2.

Although, in the above, the frequency of the clock signal CLK is switched immediately after the signal VREF designates the target value Vref, the frequency of the clock signal CLK may be switched before the target value Vref is designated. In this case, the computing circuit 12c1 decides the frequency fclk2 when receiving from the electric power control circuit 11 a signal indicating that the circuit unit 13 changes from a usual state to a standby state after a predetermined period, for example. Then, the clock signal generation circuit 12c2 switches the frequency of the clock signal CLK from the frequency fclk1 to the frequency fclk2.

When the load capacitance value C, the leak current value Ileak, and the electric potential difference ΔV are already known with respect to the circuit unit 13, occurrence of undershoot can be reduced in the above electric power supply device 61.

In the above, one aspect of the electric power supply device and the semiconductor device of the present disclosure is described on the basis of the embodiments, this is just an example and not limited to the above description.

According to the disclosed electric power supply device and the semiconductor device, occurrence of undershoot at the time of electric power supply voltage adjustment can be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electric power supply device comprising:
    a voltage adjustment circuit including a plurality of switches that are connected in parallel between a circuit unit and an electric power supply line to which a first electric power supply voltage is applied, and configured to adjust a magnitude of a second electric power supply voltage generated based on the first electric power supply voltage, by changing a number of switches turned off among the plurality of switches, based on a comparison result between a target value and the second electric power supply voltage supplied to the circuit unit;
    a memory circuit configured to store a current value generated between a first power supply terminal and a second power supply terminal of the circuit unit in a second state that is lower in electric power consumption than a first state, a first time in which the second electric power supply voltage changes from a first value to a second value, and an electric potential difference by which the second electric power supply voltage changes when one of the plurality of switches switches between on and off; and
    a control circuit configured to decide an interval of time points at which the voltage adjustment circuit increases the number of switches turned off when the circuit unit changes from the first state to the second state, based on the current value, the first value, the second value, the first time, and the electric potential difference.

2. The electric power supply device according to claim 1, wherein
    the control circuit calculates a load capacitance value of the circuit unit based on the current value generated when the second electric power supply voltage is the second value, the first time, the first value, and the second value, and decides the interval based on the load capacitance value, the electric potential difference, and the current value generated when the second electric power supply voltage is the target value.

3. The electric power supply device according to claim 2, wherein
    the interval is a value obtained by dividing a product of the load capacitance value and the electric potential difference by the current value generated when the second electric power supply voltage is the target value.

4. The electric power supply device according to claim 1, wherein
    the control circuit changes a frequency of a clock signal that decides a time point for switching the plurality of switches between on and off, based on the interval, the first time is a time that it takes for the second electric power supply voltage to change from the first value in the first state to the second value in the second state, and
    the second value is set in such a manner that the first time is equal to or smaller than a cycle of the clock signal generated when the circuit unit is in the first state.

5. The electric power supply device according to claim 1, further comprising
    a time detection circuit configured to detect the first time,
    wherein the control circuit decides the interval based on the first time detected by the time detection circuit.

6. The electric power supply device according to claim 1, wherein
    the memory circuit stores current values respectively corresponding to a plurality of values of the second electric power supply voltage, and
    the control circuit reads out, from the memory circuit, a current value corresponding to a value of the second electric power supply voltage in the second state, and decides the interval.

7. The electric power supply device according to claim 1, further comprising
    a current detection circuit configured to detect the current value,
    wherein the control circuit decides the interval based on the current value detected by the current detection circuit.

8. A semiconductor device comprising:
    a circuit unit;
    an electric power supply device including
        a voltage adjustment circuit including a plurality of switches that are connected in parallel between the circuit unit and an electric power supply line to which a first electric power supply voltage is applied, and configured to adjust a magnitude of a second electric power supply voltage generated based on the first electric power supply voltage, by changing a number of switches turned off among the plurality of switches, based on a comparison result between a target value and the second electric power supply voltage supplied to the circuit unit,
        a memory circuit configured to store a current value generated between a first power supply terminal and a second power supply terminal of the circuit unit in a second state that is lower in electric power consumption than a first state, a first time in which the second electric power supply voltage changes from a first value to a second value, and an electric potential difference by which the second electric power supply voltage changes when one of the plurality of switches switches between on and off, and
        a control circuit configured to decide an interval of time points at which the voltage adjustment circuit increases the number of switches turned off when the circuit unit changes from the first state to the second state, based on the current value, the first value, the second value, the first time, and the electric potential difference; and
    an electric power control circuit configured to inform the electric power supply device whether to set the circuit unit in the first state or in the second state.

* * * * *